United States Patent
Mack

(10) Patent No.: US 7,772,932 B1
(45) Date of Patent: Aug. 10, 2010

(54) QUADRATURE LOCAL OSCILLATOR GENERATION FOR DIRECT CONVERSION RADIO TRANSCEIVER

(75) Inventor: Michael P. Mack, Sunnyvale, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 59 days.

(21) Appl. No.: 11/952,027

(22) Filed: Dec. 6, 2007

(51) Int. Cl.
*H03B 21/02* (2006.01)
(52) U.S. Cl. .............................. 331/38; 331/22; 331/45
(58) Field of Classification Search ................... 331/38, 331/22, 45
See application file for complete search history.

(56) References Cited

U.S. PATENT DOCUMENTS

| | | | |
|---|---|---|---|
| 2007/0081610 A1* | 4/2007 | Krivokapic et al. | 375/302 |
| 2008/0100387 A1* | 5/2008 | Chen et al. | 331/22 |

\* cited by examiner

*Primary Examiner*—Joseph Chang
(74) *Attorney, Agent, or Firm*—Bever, Hoffman & Harms, LLP; Jeanette S. Harms

(57) ABSTRACT

A method of generating a quadrature local oscillator (LO) frequencies is provided. In this method, a voltage-controlled oscillator (VCO) frequency can be mixed with a divided version of the VCO frequency to generate mixed signals. A lower sideband of the mixed signals can be selected for the quadrature LO frequencies to minimize the occurrence of spurs. Notably, the divided version is 1/N of the VCO frequency and the VCO frequency is a radio frequency (RF) channel frequency times a ratio N/(N−1).

1 Claim, 2 Drawing Sheets

QUADRATURE LOCAL OSCILLATOR GENERATION FOR DIRECT CONVERSION RADIO TRANSCEIVER

BACKGROUND OF THE INVENTION

1. Field of the Invention

The present invention relates to local oscillator generation and in particular to an improved quadrature local oscillator generation that can advantageously minimize the occurrence of spurs.

2. Related Art

Direct conversion radio transceivers require local oscillator (LO) signals at the radio frequency (RF) channel frequency to down-convert received RF signals to baseband and up-convert baseband signals to RF. To avoid voltage-controlled oscillator (VCO) pulling problems, the LO signals should not be generated by a phase-locked loop (PLL) running at the RF channel center frequency (or one of its harmonics). To solve this problem, the VCO can be set to a predetermined fraction of the RF channel frequency, wherein the VCO output can be mixed with quadrature divided versions of the VCO output. The upper side band of the mixer output is selected as the LO at the RF channel frequency.

For example, FIG. 1 illustrates a conventional quadrature local oscillator (LO) generator 100 that includes a VCO 101, two mixers 102 and 103, and a divider 104. As shown in FIG. 1, VCO 101 is set to ⅔ of the RF channel frequency. A divider 104 divides the RF channel frequency by ½, thereby generating ⅓ RF at its outputs. Mixers 102 and 103 each receive the VCO output (⅔ RF) as well as the quadrature divided versions of the VCO output (⅓ RF). Therefore, mixers 102 and 103 can generate an RF LO I and an RF LO Q, respectively, at the RF channel frequency by choosing the upper sideband (i.e. ⅔ RF+⅓ RF). Unfortunately, this configuration produces spurs due to the unwanted lower sideband in the LO output, which must be suppressed by filtering or an image rejection mixer (not shown). Therefore, a need arises for a quadrature LO generator that minimizes the occurrence of spurs.

SUMMARY OF THE INVENTION

A quadrature local oscillator (LO) generator that minimizes the occurrence of spurs is described. This quadrature LO generator can include a voltage-controlled oscillator (VCO), a divider, and two mixers. The divider can be connected to receive an output of the VCO. Both mixers can be connected to receive the output of the VCO and outputs of the divider. The first mixer can be configured to generate a first LO radio frequency (RF), whereas the second mixer can be configured to generate a second LO RF frequency. In one embodiment, the first and second LO RF frequencies provide I and Q components, respectively, of the RF frequency. Notably, the divider has a division ratio "N" and a VCO frequency is set to an RF channel frequency times the ratio N/(N−1). In this configuration, the lower sideband of the mixed signals can be selected for the LO outputs, thereby minimizing the occurrence of spurs.

A method of generating a quadrature local oscillator (LO) frequency is also described. In this method, a voltage-controlled oscillator (VCO) frequency can be mixed with a divided version of the VCO frequency to generate a mixed signal. A lower sideband of the mixed signal can be selected for the quadrature LO frequency to minimize the occurrence of spurs. Notably, the divided version is 1/N of the VCO frequency and the VCO frequency is a radio frequency (RF) channel frequency times a ratio N/(N−1).

DETAILED DESCRIPTION OF THE FIGURES

Figure 2:
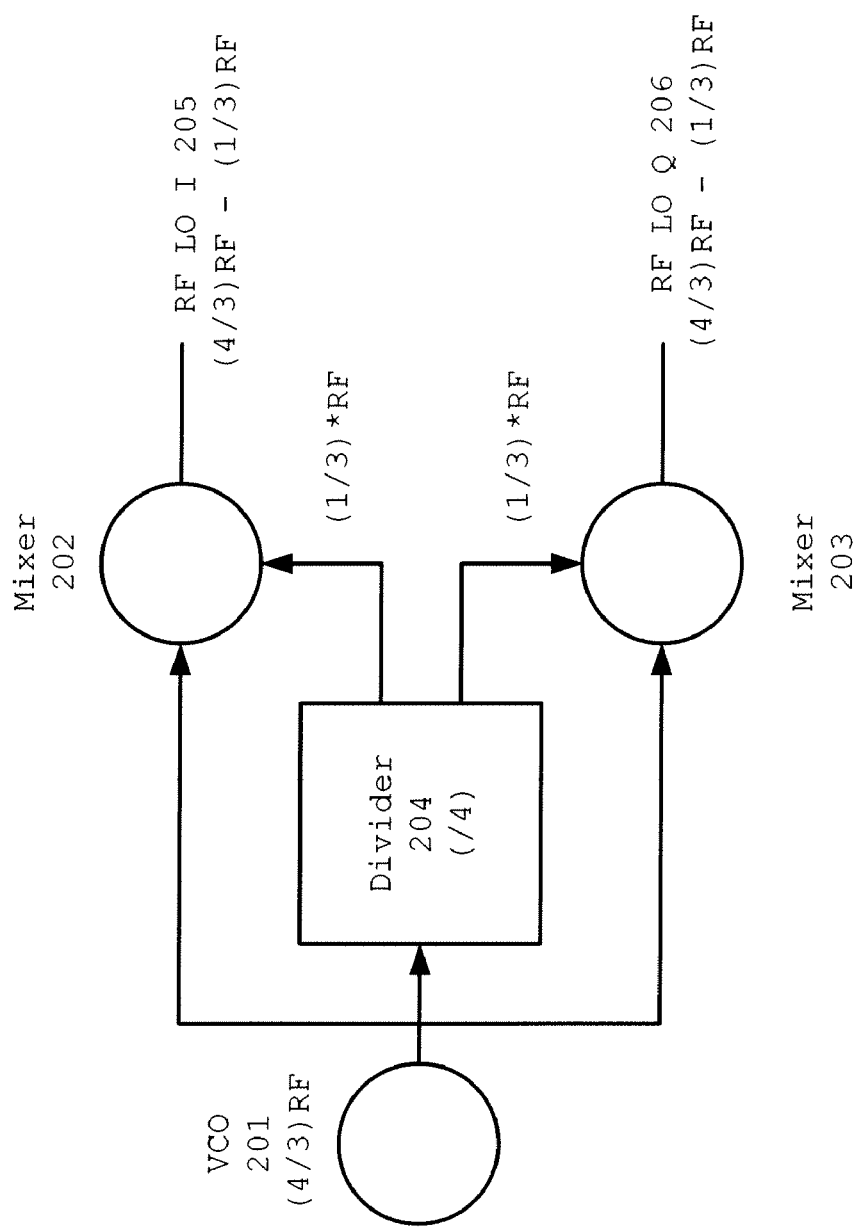
FIG. 2 illustrates a quadrature LO generator in accordance with the present invention that minimizes the occurrence of spurs.

FIG. 2 illustrates a quadrature local oscillator (LO) generator 200 in accordance with the present invention that minimizes the occurrence of spurs. In this embodiment, quadrature LO generator 200 includes a VCO 201, two mixers 202 and 203, and a divider 204. As shown in FIG. 2, VCO 201 is set to ⅘ of the RF channel frequency. Divider 204 divides the VCO 201 output frequency by 4, thereby generating ⅕ RF at its outputs. Mixers 202 and 203 each receive the VCO output (⅘ RF) as well as the quadrature divided versions of the VCO output (⅕ RF). Therefore, mixers 202 and 203 can generate an RF LO I and an RF LO Q, respectively, at the RF channel frequency by selecting the lower sideband (i.e. ⅘ RF−⅕ RF). This configuration advantageously minimizes the occurrence of spurs because it selects the lower sideband to obtain the LO at the RF channel frequency.

Figure 1:
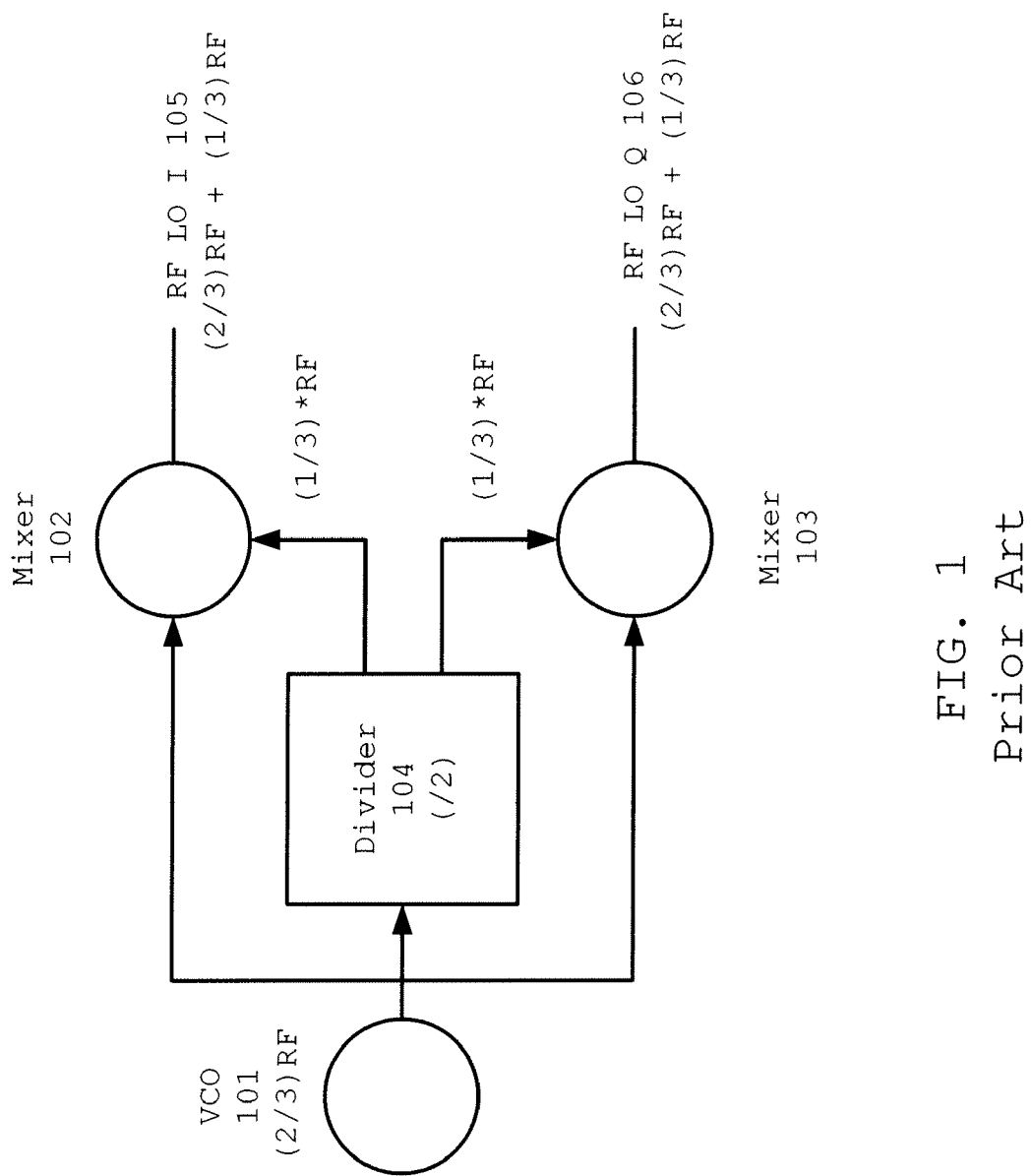
FIG. 1 illustrates a conventional quadrature LO generator that generates spurs.

That is, in general, mixing produces an upper and a lower sideband. In FIG. 1, the spur is in the lower sideband, whereas in FIG. 2, the spur is in the upper sideband. Thus, the configuration of FIG. 2 moves the spur to a different frequency. Advantageously, the configuration of FIG. 2, when used to generate an RF LO for the 2.4 GHz band, can ensure that the spur will not be at 800 MHz, i.e. a GSM frequency.

Note that although VCO 201 and divider 204 are described with respect to specific RF channel frequency and divider values, other embodiments may employ different values. For example, another quadrature LO generator embodiment could include a VCO frequency of ⅝ RF and a ⅛ divider that generates ¼ RF. Yet another quadrature LO generator embodiment could include a VCO frequency of 9/8 RF and a ⅛ divider that generates ⅛ RF.

Thus, in general, a quadrature local oscillator can be produced by mixing the VCO frequency with the quadrature versions of the VCO frequency and selecting the lower sideband for the LO outputs. And, more specifically, the divider in the quadrature LO generator has a division ratio "N" (N being an integer greater than 1) and the VCO frequency is set to the RF channel frequency times the ratio N/(N−1).

Although illustrative embodiments of the invention have been described in detail herein with reference to the accompanying figures, it is to be understood that the invention is not limited to those precise embodiment. They are not intended to be exhaustive or to limit the invention to the precise forms disclosed. As such, many modifications and variations will be apparent to practitioners skilled in this art. Accordingly, it is intended that the scope of the invention be defined by the following claims and their equivalents.

The invention claimed is:

1. A method of generating a quadrature local oscillator (LO) frequency, the method comprising:
   mixing a voltage-controlled oscillator (VCO) frequency with a divided version of the VCO frequency to generate a mixed signal; and
   selecting a lower sideband of the mixed signal for the quadrature LO frequency,
   wherein the divided version is 1/N of the VCO frequency and the VCO frequency is a radio frequency (RF) channel frequency times a ratio N/(N−1).

* * * * *